United States Patent [19]

White et al.

[11] Patent Number: 4,710,725
[45] Date of Patent: Dec. 1, 1987

[54] PREAMPLIFIER FOR AN IMAGING SYSTEM

[75] Inventors: Charles M. White, Liverpool; Wayne T. Green, Mexico, both of N.Y.

[73] Assignee: General Electric Company, Charlottesville, Va.

[21] Appl. No.: 643,408

[22] Filed: Aug. 23, 1984

[51] Int. Cl.$^4$ ............................................. H03F 1/14
[52] U.S. Cl. ......................................... 330/51; 330/9; 330/300
[58] Field of Search ............... 307/540, 544, 546, 554; 330/9, 51, 279, 285, 300; 383/165; 357/24; 358/213, 176

[56] References Cited

U.S. PATENT DOCUMENTS 3,681,703  8/1972  Johnson ........................... 330/51 X

OTHER PUBLICATIONS

Baker, W. D., Barbe, D. F. and Sumney L. W., "Charge Coupled Device Applications", *Naval Research Review*, Dec. 1974, pp. 22-45.

*Primary Examiner*—Eugene R. LaRoche
*Assistant Examiner*—Steven J. Mottola
*Attorney, Agent, or Firm*—Irving M. Freedman

[57] ABSTRACT

A preamplifier for use in an imaging system including a charge-injection device employs an amplifier, at least a first switch and a clamping loop. The switch is capable of grounding the amplifier reference outside the blanking interval and is open during at least a portion of the blanking interval, thereby preventing the amplifier from entering saturation during the charge injection performed by the charge-injection device. The clamping loop serves to maintain the output of the preamplifier at a predetermined constant level during that portion of the blanking interval in which the amplifier is disabled. The inventive preamplifier has a reduced input impedence and capacitance, and thus operates with less overall noise.

6 Claims, 4 Drawing Figures

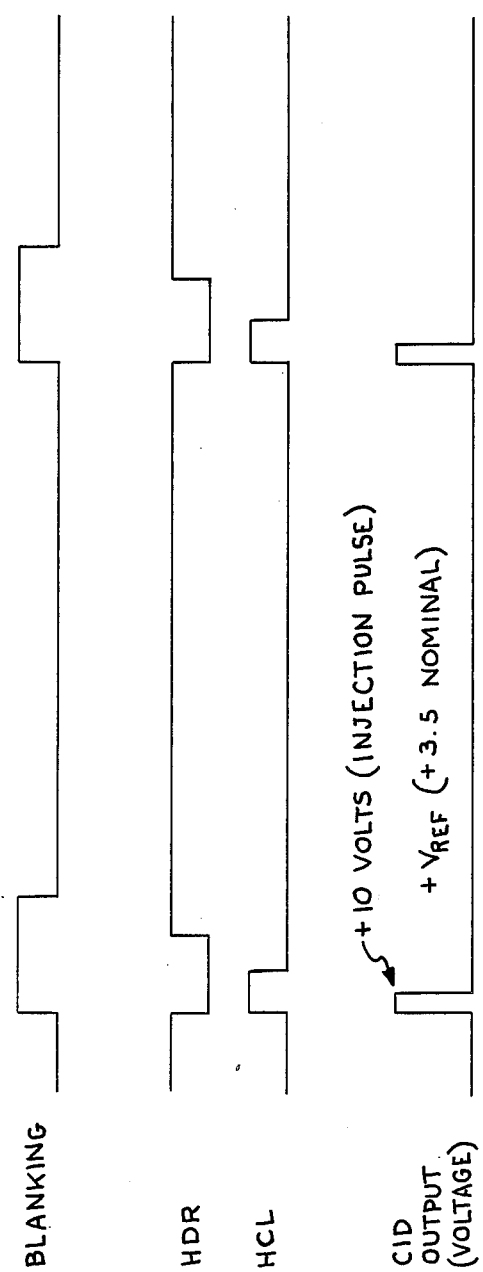

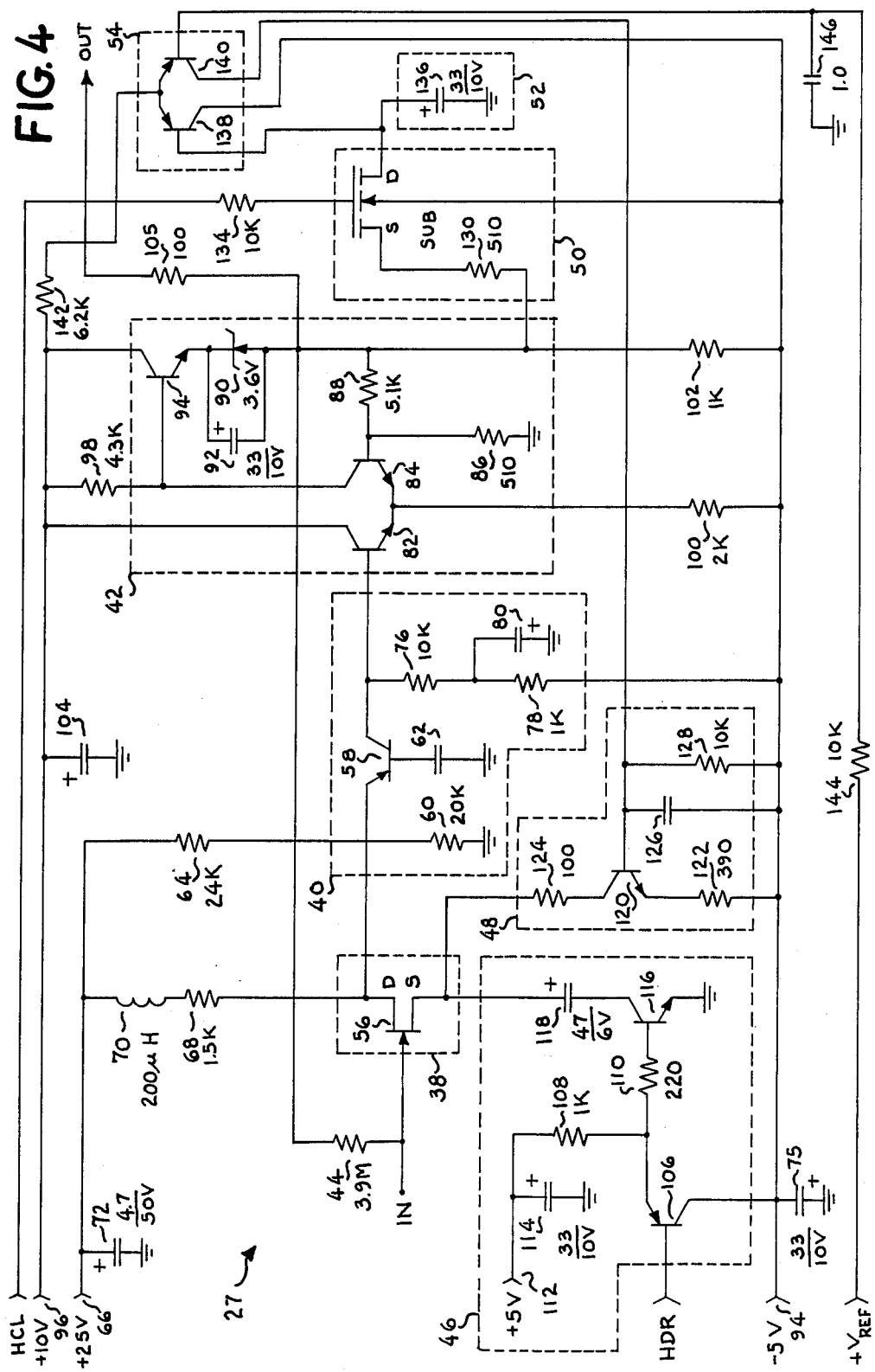

PREAMPLIFIER FOR AN IMAGING SYSTEM

BACKGROUND OF THE INVENTION

The present invention relates to electro-optical imaging systems and, more particularly, to preamplifiers for solid state imaging systems.

Electro-optical imaging sensors are roughly divided into camera-tubes contained within evacuated envelopes and solid state imaging sensors in which a charge pattern is created by the impingement of light on a solid state matrix array. One type of solid state imaging sensor, which forms the environment with which the present invention is employed, is commonly known as a charge-injection device (CID). The principles underlying charge-injection device imagers are detailed in U.S. Pat. Nos. 3,805,062; 3,949,162; 4,000,418; 4,011,441 and 4,011,442, the disclosures of which are herein incorporated by reference.

In brief, a charge-injection device employs a silicon substrate having orthogonal row and column conductors thereon which are insulated both from the substrate and from each other. Each intersection of a row conductor with a column conductor provides two storage locations, one under the row conductor and the other under the column conductor, within which charges liberated from the silicon substrate by incident radiation may be stored by the application of appropriate voltages. The stored charges, when appropriately read out, form the video signal.

Using an appropriately doped silicon substrate such as, for example, an n-type semiconductor, a negative voltage applied to a row or column conductor is effective to produce a depletion region forming a potential well thereunder. The potential well functions as a capacitor to collect the charges liberated by incident radiation. Although mutually insulated, the potential wells under the row and column conductors at an intersection thereof are so closely coupled that charges may be transferred back and forth therebetween without loss of stored charge. Whichever one of the row and column conductors is maintained at the more negative potential captures all of the charge from the one maintained at a less negative potential. In order to transfer the charge from beneath one conductor to beneath the other conductor, the voltage on the conductor originally having the larger negative voltage is reduced to a value less than the negative voltage on the originally less negative conductor. Equivalently, the negative voltage on the previously less negative conductor may be increased until it exceeds the negative voltage on the first-mentioned conductor.

In one technique described in the referenced patents, at all times except during the reading-out process, the row conductors are maintained more negative than the column conductors. The liberated charges are therefore totally contained under the row conductors. In preparation for reading out a row, the row voltage is raised until it attains a less-negative voltage intermediate the column voltage and ground. This transfers all of the accumulated charges simultaneously in the selected row from beneath all of the row conductors to beneath their respective column conductors. The negative voltages on the column conductors are then increased one at a time in sequence to a less negative voltage than the selected row conductor. The less negative voltage may conveniently be zero volts. As the voltage on each column conductor is increased to zero, the charge stored thereunder flows back beneath its associated row conductor within the row being read out. The flow of charges in the row conductor occasioned by the transfer of charge from each column conductor is sensed to produce the output video signal. It should be noted that, since the only column conductors which contain charges are those in the selected row, the voltage sequence on the column conductors is ignored by all storage locations except those in the selected row.

The readout sequence described above is non-destructive; that is, at the end of reading the stored charges in a row, the charges, although they have been transferred first from beneath the row conductors to beneath the column conductors and then have been sequentially transferred back gain, remain in their original locations, undiminished. If the original voltages are restored on the row and column conductors, continued integration of incoming radiation without erasure of the previously stored charges may be performed. This is especially useful in low-light-level applications. In normal imaging applications, it is useful to erase the stored charges in a row just after it is read out so that a new charge pattern may be integrated until the next time the row is scheduled ior readout. The charges in a row are readily cancelled or erased by raising the selected row voltage to zero while the column voltages are also at zero. This injects sufficient charges into the storage locations to cancel any charge pattern which they may have acquired, and hence the name "charge-injection device".

Charge-injection devices have a high output impedence (several megohms and 12–15 pf) during the normal interval during which a horizontal line is displayed on the video monitor (line scan interval). Ideally, the load driven by the charge-injection device should have a low input impedence during the line scan interval, but a high input impedence during the charge-injection phase.

Noise is a problem in all imaging devices. The type of noise and its severity varies with the type of imaging device and with its required peripheral equipment. Charge-injection imaging devices suffer from two sources of noise giving rise to pattern noise; namely, switching noise and capacitance variation noise.

Reducing the input capacitance of the load driven by the charge-injection device lowers the overall noise of the imaging device. It has, however, heretofore been impractical to do so. Adding an element to the output of the charge-injection device to isolate the amplifier from the charge injection device injection device injection pulses increases input capacitance and resistance, degrading the signal-to-noise ratio thereof.

In the prior art, the charge-injection device drives a differential current-mode preamplifier as its load. This configuration has a high impedance during the charge-injection pulse, and a low impedance during the line scan interval, as is desired. However, this configuration prevents the use of sophisticated noise cancellation techniques because the only available output thereof corresponds to the difference in its two output currents. This severely limits the utility of the prior art imaging devices, as they are subject to the problems with noise noted above.

OBJECTS AND SUMMARY OF THE INVENTION

Accordingly, it is an object of the invention to provide an improved preamplifier for use in an imager, including a charge-injection device, which overcomes the drawbacks of the prior art, It is a further object of the invention to provide a preamplifier having a low input impedance.

It is a further object of the invention to provide a preamplifier having a reduced input capacitance compared to those of the prior art.

It is a further object of the invention to provide a preamplifier including means for disabling an amplifier therein during at least a portion of a blanking interval of a video display.

It is a further object of the invention to provide a preamplifier including means for clamping the output thereof to a predetermined level during at least a portion of the blanking interval.

Briefly stated, the present invention provides a preamplifier for use in an imaging system including a charge-injection device. The preamplifier includes an amplifier, at least a first switch and clamping loop. The switch is capable of grounding the amplifier reference node outside the blanking interval and is open during at least a portion of the blanking interval, thereby preventing the amplifier from entering saturation during the charge injection performed by the charge-injection device. The clamping loop serves to maintain the output of the preamplifier at a predetermined constant level during that portion of the blanking interval during which the amplifier is disabled. The inventive preamplifier has a reduced input impedance and capacitance, and thus operates with less overall noise.

According to an embodiment of the invention there is provided a preamplifier for use in an imaging system including a charge-injection device, the preamplifier comprising first amplifying means for amplifying an input signal supplied to the first amplifying means by the charge-injection device, the first amplifying means being of a type which has a low impedance when seen from its input, switching means for switching the first amplifying means into a first condition when a first reference signal is in a first predetermined condition, and for switching the first amplifying means into a second condition when the first reference signal is in a second predetermined condition and output generating means coupled to an output of the first amplifying means for comparing the amplified input signal with a second reference signal, and generating an output signal based on the comparison.

According to a feature of the invention there is provided a preamplifier for use in an imaging system including a charge-injection device, the preamplifier comprising amplifying means for amplifying an input signal from the charge-injection device, output generating means coupled to an output of the amplifying means, for comparing the amplified input signal with a first reference signal, and generating an output signal based on the comparison, clamping means having an input coupled to an output of the output generating means, and an output coupled to an input of the amplifying means, for clamping the output of the amplifying means at a first potential in response to a second reference signal.

According to a feature of the invention there is provided a preamplifier for use in an imaging system including a charge-injection device, the preamplifier comprising first amplifying means for amplifying an input signal supplied to the first amplifying means by the charge-injection device, the first amplifying means being of a type which has a low impedance when seen from its input, switching means for switching the first amplifying means into a first condition when a first reference signal is in a first predetermined condition, and for switching the first amplifying means into a second condition when the first reference signal is in a second predetermined condition, output generating means coupled to an output of the first amplifying means, for comparing the amplified input signal with a second reference signal, and generating an output signal based on the comparison and clamping means having an input coupled to an output of the output generating means, and an output coupled to an input of the first amplifying means, for clamping the output of the first amplifying means at a first potential in response to a third reference signal.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 3 is a timing diagram of some of the signals used in the preamplifier of FIG. 2.

FIG. 4 is a schematic diagram of the preamplifier of FIG. 2.

DETAILED DESCRIPTION OF THE PREFERRED EMBODIMENT

Figure 1:
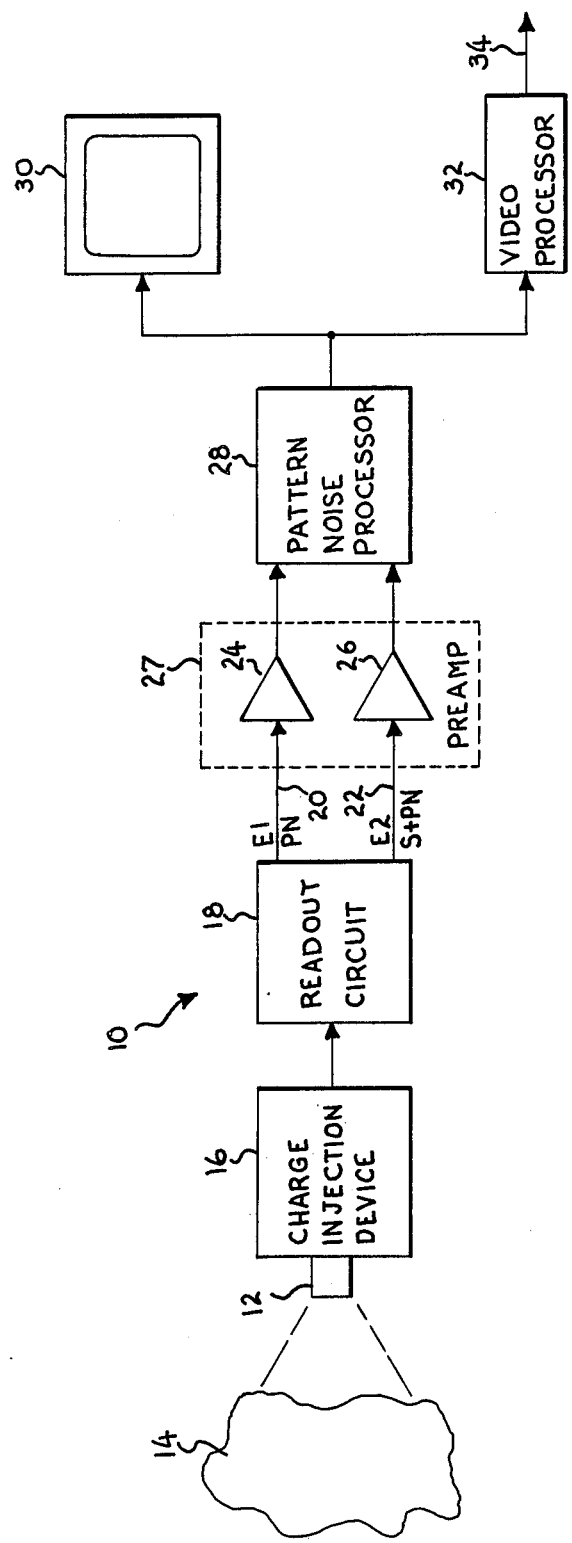
FIG. 1 is a simplified block diagram of a solid state imaging system according to an embodiment of the invention.

Referring to FIG. 1, there is shown, generally at 10, a solid state imaging system according to an embodiment of the invention. A lens 12 images a pattern of light intensities from a scene 14 onto a matrix array of a charge-injection device 16. Two video signals, E1 and E2, are read out from charge-injection device 16 by a readout circuit 18. Video signals E1 and E2 are applied on lines 20 and 22 to respective inputs of preamplifiers 24 and 26, to be more fully detailed hereinafter, in a preamplifier subsystem 27. Video signal E1, applied to preamplifier 24, contains only pattern noise PN from the sensor row which was read out and then erased in the immediately preceding horizontal interval. Video signal E2, applied to preamplifier 26, contains video plus unwanted pattern noise S+PN from the row immediately following the one providing signal E1.

A pattern noise processor 28 receives the amplified versions of video signals E1 and E2 and provides noise cancellation of both capacitance variation noise and switching noise from the video signal in order to provide substantially noise-free video to following circuits such as, for example, a video monitor 30 or a video processor 32. Video processor 32 may be, for example, a portion of a robotics system (the remainder of which is not shown) for performing pattern recognition or other activity on the video signal. The processed video from video processor 32 is applied on a line 34 to external circuits which are not of concern to the present invention.

In some embodiments of charge-injection device 16 and readout circuit 18, it is convenient to alternate the signals on lines 20 and 22 whereby, in one horizontal interval, line 20 contains the new video data and line 22 contains pattern noise and, in the next horizontal interval, line 22 contains the new video data and line 20 contains pattern noise. One skilled in the art would recognize that a conventional multiplexer (not shown) may be used following preamplifier subsystem 27 to alternately reverse the lines on which such signals are fed from readout circuit 18 to succeeding circuits and such an Referring now to the simplified block diagram of FIG. 2, there is shown, in greater detail, preamplifier 24 of FIG. 1. Preamplifiers 24 and 26 are identical, and the following description of preamplifier 24 therefore applies equally to preamplifier 26. For ease of discussion, the input signal thereto is simply denominated IN, rather than E1, and the output signal thereof is denominated OUT.

Preamplifier 24 includes a first amplifier stage 36, comprising an input amplifier 38 and a grounded base amplifier 40 coupled in series. Input signal IN to preamplifier 24 is fed on a line to first input of input amplifier 38. An output of input amplifier 38 is coupled to an input of grounded base amplifier 40, an output of which is, in turn, coupled to an input of amplifier 42. An output of amplifier 42 serves as output signal OUT of preamplifier 24. A feedback resistor 44 is coupled to both the output of amplifier 42 as well as the first input of input amplifier 38. A first switch 46, driven by a first input control signal HDR, is coupled to a second input oi input amplifier 38. A voltage-controlled current sink which is illustrated second switch 48, is coupled to a third input of input amplifier 38. Preamplifier 24 further comprises a third switch 50 coupled to input amplifier 38 which has a first input, coupled to the output of amplifier 42, and a second input coupled to receive a second input control signal HCL. An output of third switch 50 is coupled to an input of memory 52. Memory 52 has an output which is fed on a line to a plus input of a differential amplifier 54. A third input control signal VRef is fed on a line to a minus input of differential amplifier 54. An output of differential amplifier 54 is coupled to an input of second switch 48.

Figure 2:
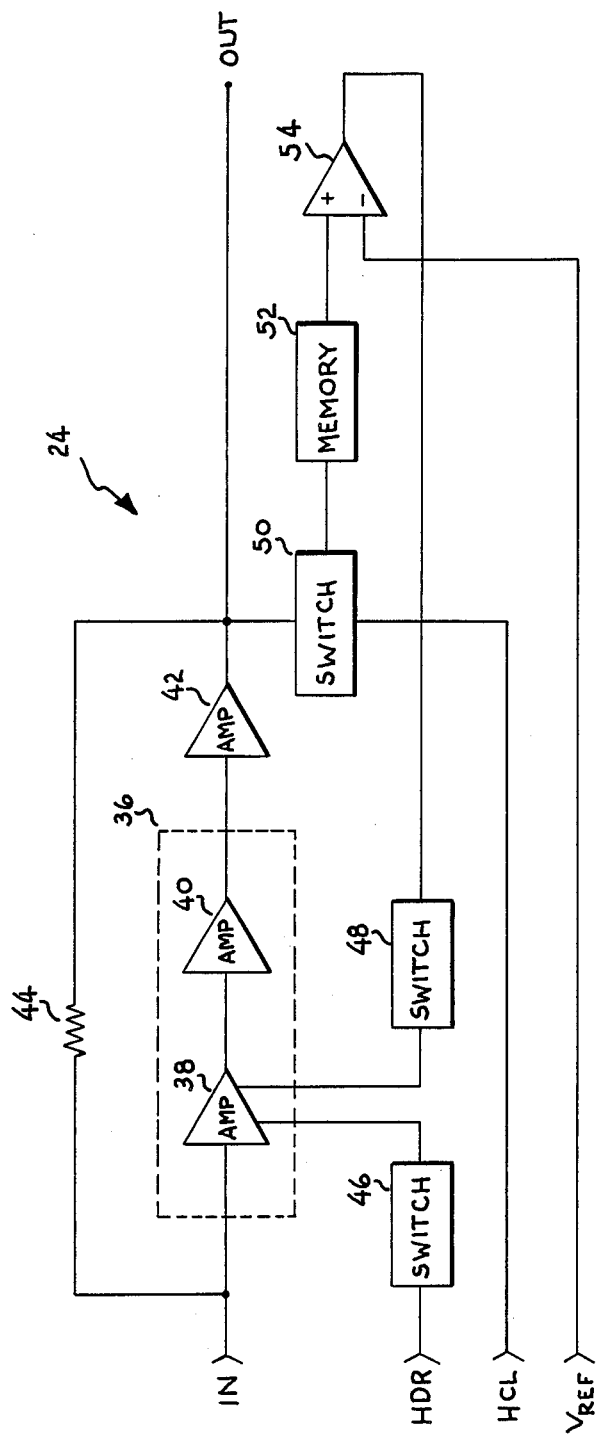
FIG. 2 is a simplified block diagram of the preamplifier of the system shown in FIG. 1.

The circuit illustrated in FIG. 2 serves as an input preamplifier in charge-injection solid state imaging system 10 described broadly above, and does so with a reduced input impedance during the normal scanning period, thereof, while presenting a high input impedence thereto during the charge-injection injection period.

The functioning of preamplifier 24 is best understood with reference to the timing diagram of FIG. 3, and so a brief description thereof is in order. As shown in FIG. 3, a normal scan line of video monitor 30 (FIG. 1) comprises a normal scanning interval, during which HDR is high, interrupted by a video blanking interval. The blanking interval is defined as that time during which the "blanking" signal is high. There is a small period during which both HDR and the blanking signal are high, but this slight overlap is not of any importance here.

A number of things happen at the beginning of the blanking interval. First HDR goes low, indicating that input signal IN, which normally carries the video signal for display, should not be read. Next, HCL goes high, but remains high for less than the duration of the entire blanking interval. Additionally, the charge-injection device output voltage goes high, to its injection pulse output of approximately +10 volts. The injection pulse also remains high for less than the entire period of the blanking interval, and for a period even shorter than that during which HCL is high. At the termination of the injection pulse, the charge-injection device output voltage returns to its usual level of approximately +3.5 volts. This voltage is the VRef signal, and is referred to as the pedestal voltage.

During the normalvideo scan line, it is necessary for preamplifier 24 to generate output signal OUT carrying therein all of the video information contained in input signal IN, less the distortion caused by the residual noise signal from the varying cells of the charge-injection device, as previously described.

Referring now also to FIG. 2, during the normal scanning interval, when HDR is high, first switch 46 enables input amplifier 38 placing it into a first predetermined gated condition. In this condition, input amplifier 38 operates as a single stage amplifier, amplifying the input signal IN, including the residual noise level contained therein, and applying the signal to the input of grounded base amplifier 40. Grounded base amplifier 40 further amplifies input signal IN and applies it, in turn, to the input of amplifier 42. Grounded base amplifier 40 serves a further purpose by limiting the impedance seen at the input of input amplifier 38, and thereby lessening the overall Miller capacitance seen at the input of input amplifier 38. This lessens the overall input capacitance of the circuit during the scanning interval which, as stated, lessens tbe inherent noise level therein. Other details of the functioning of the circuit during the normal scanning interval will be discussed below.

At the beginning of the blanking interval, HDR goes low and HCL goes high. When HDR goes low, first switch 46 disables input amplifier 38, thereby placing it into a second predetermined gated condition wherein no amplification of the input signal IN takes place and the output of input amplifier 38 is a constant DC signal. The output of grounded base amplifier 40, being connected in series with input amplifier 38, also remains constant, varying only in concert with the output of input amplifier 38. The output signal OUT of amplifier 42 is also constant due to the constant nature of the output of first amplifier stage 36.

By disabling input amplifier 38 when HDR goes low, first switch 46 prevents it from becoming saturated during that period of time when the charge-injection device injection pulse goes high. This aspect of the circuit prevents the components of input amplifier 38 from going into saturation, and therefore eliminates the need to allow those components to recover after the injection pulse, and also prevents any interference with the basic operation of the imager resulting from that saturation. This contributes to the overall high input AC impedance of preamplifier 24 during the injection period.

As previously stated, when HDR goes low, HCL goes high. This change in HCL actuates third switch 50 to take the input signal, which represents the averge DC voltage during the high condition of HCL, and store the resulting output signal in memory 52. The stored voltage is then fed on a line to a plus input of differential amplifier 54 and compared with the DC voltage existing at the imaging system output during the precharge and scanning process of the imaging system, i.e., VRef, which is fed on a line to the minus input of differential amplifier 54. The output of differential amplifier 54, which is essentially the DC bias required for proper operation of input amplifier 38, is applied to the input of second switch 48. Second switch 48, in turn, reacts to the applied signal by clamping the output of input amplifier 38 at approximately VRef.

At the beginning of the scanning interval, when HDR again goes high, a clamping loop comprising third switch 50, memory 52, differential amplifier 54 and second switch 48 causes the output current of input amplifier 38 to be equal to its input current, and consequently causes output voltge OUT to be equal to VRef.

Accordingly, the inventive circuit shown in FIG. 2 serves to permit the more efficient preamplification of the input signal to the circuit of FIG. 1.

The circuit of FIG. 2 is shown in greater detail in FIG. 4, with the preferred values of the elements thereof set forth therein. As depicted, input amplifier 38 consists essentially of a FET 56, whose gate is coupled to receive input signal IN. The gate of FET 56 is also coupled to a first end of feedback reisstor 44. An emitter of a p-n-p transistor 58 is coupled to the drain of FET 56. A biassing network coupled to a base of transistor 58 consists of a grounded resistor 60, a grounded capacitor 62, and one end of a second resistor 64. The other end of resistor 64 is coupled to a +25V voltage source 66. The biassing network further includes a third resistor 68 coupled at a first end thereof to the emitter of transistor 58, and coupled at an opposite end thereof to a first end of an inductor 70. Inductor 70, in turn, is coupled at its opposite end to voltage source 66. Voltage source 66 is further coupled to grounded capacitor 72. The purpose and functioning of the various components of the biassing network are well understood in the art, and so will not be discussed in unnecessary detail herein.

A collector of transistor 58 generates an output thereof, which is coupled to form the input to amplifier 42, and is also coupled to a second voltage source 74 having a voltage of −5V, through a circuit comprising two resistors 76 and 78, and a grounded capacitor 80. A first end of resistor 76 is connected to the collector of transistor 58, while a second end thereof is connected both to a first end of resistor 78 and a first end of capacitor 80. A second end of capacitor 80 is grounded, while a second end of resistor 78 is coupled directly to voltage source 74. Voltage source 74 is also coupled to an end of a grounded capacitor 75.

Amplifier 42 consists of two emitter-coupled transistors 82 and 84. The common emitters of transistors 82 and 84 are coupled to voltage source 74 through a resistor 100. The base of transistor 82 is coupled to the output of transistor 58, while the base of transistor 84, which generates the output signal of preamplifier 24, is coupled to a grounded resistor 86, and a first end of a resistor 88. A second end of resistor 88 comprises the output of amplifier 42, and is coupled both to a second end of feedback resistor 44 and to voltage source 74 across a resistor 102. The second end of resistor 88 is further coupled to a first end of a resistor 105, the second end of which forms the output of preamplifier 24, as well as to a first end of a parallel combination of a Zener diode 90 and a capacitor 92. A second end of that parallel comhination is coupled to an emitter of an n-p-n transistor 94. The collector of n-p-n transistor 94 is coupled to a third voltage source 96, and the base thereof is coupled both to a collector oi transistor 84 and a first end of a resistor 98. A second end of resistor 98 is coupled to voltage source 96, as is the collector of transistor 82. Voltage source 96 is also coupled to an end of a grounded capacitor 104.

First switch 46 consists of a p-n-p transistor 106, the base of which is coupled to receive first input control signal HDR as previously described. The collector oi p-n-p transistor 106 is coupled to voltage source 74, and the emitter of transistor 106 is connected both to a first end of a resistor 108 and a first end of a resistor 110. A second end of resistor 108 is coupled to a fourth voltage source 112 having an output of +5V, as well as to one end of a grounded capacitor 114. The other end of resistor 110 is coupled to the base of an n-p-n transistor 116, the emitter of which is grounded, and the collector of which is coupled to the source of FET 56 across a capacitor 118.

Second switch 48 consists of an n-p-n transistor 120, the emitter of which is coupled to voltage source 74 across a resistor 122, and the collector of which is coupled to the source of FET 56 across a resistor 124. The base of transistor 120 is coupled to voltage source 74 across a parallel combination of a capacitor 126 and a resistor 128, and is also coupled to an output of differential amplifier 54.

Third switch 50 comprises a resistor 130, one end of which is coupled to the second end of resistor 88, and the other end of which is connected to the source of a MOSFET 132. The gate of MOSFET 132 is coupled to the source of the HCL signal, across a resistor 134. The drain of MOSFET 132 is coupled to one end of a grounded capacitor 136, which constitutes memory 52.

Second differential amplifier 54 comprises a pair of emitter-coupled n-p-n transistors 138 and 140, the common emitters of which are coupled to voltage source 96 across a resistor 142. The base of transistor 138 is coupled to the drain of MOSFET 132, and the base of transistor 140 is coupled to receive control signal VRef, across a resistor 144, as well as coupled to one end of a grounded capacitor 146. The collector of transistor 138 is coupled to voltage source 74, and the collector of transistor 140 is coupled to the base of transistor 120.

The illustrated circuit of FIG. 4 preamplifies the input signal of preamplifier 24, and does so with an improved performance with respect to prior art preampliiiers used in similar applications. Specifically, during the normal scan line, i.e. when HDR is high, transistor 116 is saturated, and so operates to AC ground the source of FET 56. When the source of FET 56 is AC grounded, FET 56 has a voltage to current gain of, in this embodiment approximately 12 mmhos. When HDR is low, transistor 116 is open (non-conductive), and this circuit path is not available.

As illustrated, transistor 120 is configured as a current sink, and thus has a high impedance, as seen by the source of FET 56 As a result of this configuration, the source of FET 56 merely sees a constant current, and so it is free to follow the voltage, as a source follower. Since the source voltage is a DC voltage, the drain current is a constant value, and is not appreciably affected by the gate voltage. Transistor 58 is coupled to the drain of FET 56 as a grounded base amplifier, which presents a low impedance to the drain of FET 56, and so limits the Miller capacitance seen at the input of FET 56, and hence at the input of preamplifier 24.

The illustrated configuration of amplifier 42 is a conventional differential video amplifier with local feedback provided by resistors 86 and 88. Feedback resistor 44 provides current feedback to the gate of FET 56 from the output of first differential amplifier 42.

In the preferred embodiment, MOSFET 132 is an enhancement type MOSFET transistor switch. When HCL goes high, MOSFET 132 becomes conductive, and applies the output voltage of first differential amplifier 42 to capacitor 136, which acts to store the average DC voltage during the time that HCL is high. The combination of resistor 130, capacitor 136 and the low duty cycle of MOSFET 132 gives a long time constant to the sampled voltage. This time constant is at least as long as the period between blanking intervals.

Second differential amplifier 54 (transistor 138 and transistor 140) compares the average voltage at the amplifier output while HCL is high with the reference DC input, VRef. As stated, VRef is the DC voltage which exists at the imaging system output during the precharge and scanning process of the imaging system.

The output of transistor 140 drives transistor 120. During the period while HCL is high and HDR is low, the output voltage of preamplifier 24 is determined simply by its internal bias. This internal bias is adjusted by the clamping loop of transistors 82, 84, 132 and 120, so that the output during this period is equal to VRef, which is approximately +3.5V.

During the normal scan line, FET 56 has a voltage gain seen at its drain, and the output voltage seen by transistor 58 is VRef Plus (or minus, depending upon the polarity of the input signal) the input video current multiplied by the resistance of feedback resistor 44.

The switching action provided by transistor 106 prevents the charge-injection device from forward biassing FET 56 during the charge-injection phase. This prevents large overdrives and saturation of preamplifier 24. If preamplifier 24 were to be driven into saturation, it would require a substantial period of time to recover, and would generate interference which would interfere with the basic operation of the imaging system.

The clamping provided by the clamping loop ensures the optimal biassing of preamplifier 24, for a minimum recovery time and minimum noise.

Having described preferred embodiments of the invention with reference to the accompanying drawings, it is to be understood that the invention is not limited to those precise embodiments and that various changes and modifications may be effected therein by one skilled in the art without departing from the scope or spirit of the invention as defined in the appended claims.

What is claimed is:

1. A preamplifier for use in an imaging system including a charge-injection device comprising:

an amplifier for amplifying a video signal;
   means for making said amplifier insensitive to an AC component of said video signal during at least a portion of a blanking interval of said video signal;
   means for differencing an output of said amplifier during said at least a portion of a blanking interval with a reference voltage and for producing a DC bias therefrom;
   means for connecting said DC bias to an input of said amplifier, whereby said output is driven toward a value equal to said reference voltage;
   means for storing a voltage effective for producing said DC bias from the end of said at least a portion of a blanking interval until the next blanking interval; and
   means for continuing to supply said DC bias existing at an end of said at least a portion of a blanking interval, whereby a DC bias required for proper operation of said amplifier is provided.

2. A preamplifier according to claim 1 wherein said means for making said amplifier insensitive includes a capacitor in series with a transistor, said capacitor and said transistor being connected for providing a ground return for said video signal, and said preamplifier including means for making said transistor non-conductive during said at least a portion of a blanking interval, whereby said ground return is removed and an AC amplification is not performed.

3. A preamplifier according to claim 2 wherein said means for continuously includes a voltage-controlled current sink responsive to the stored voltage for producing said DC bias.

4. A preamplifier according to claim 1 wherein said means for storing includes a capacitor and a transistor, said transistor being connected between said output of said amplifier and said capacitor, and means for turning on said transistor during said at least a portion of a blanking interval and for turning it off at all other times.

5. A preamplifier according to claim 1, wherein said amplifier includes means to limit a Miller capacitance of said preamplifier.

6. A preamplifier according to claim 5, wherein said means to limit said Miller capacitance includes a FET having a drain, and a grounded base amplifier coupled to said drain of said FET.

* * * * *